US 6,614,218 B1

(12) United States Patent
Ray (10) Patent No.: US 6,614,218 B1
(45) Date of Patent: Sep. 2, 2003

(54) CURRENT MEASURING DEVICE

(75) Inventor: William Frederick Ray, Attenborough (GB)

(73) Assignee: Power Electronic Measurements Limited, Attenborough (GB)

( * ) Notice: Subject to any disclaimer, the term of this patent is extended or adjusted under 35 U.S.C. 154(b) by 0 days.

(21) Appl. No.: 09/673,434

(22) PCT Filed: Apr. 22, 1999

(86) PCT No.: PCT/GB99/01235

§ 371 (c)(1),
(2), (4) Date: Oct. 18, 2000

(87) PCT Pub. No.: WO99/54740

PCT Pub. Date: Oct. 28, 1999

(30) Foreign Application Priority Data

Apr. 22, 1998 (GB) .............................. 9808580
Jul. 3, 1998 (GB) .............................. 9814487

(51) Int. Cl.$^7$ .............................. G01R 33/00
(52) U.S. Cl. .................. 324/117 R; 324/126; 324/127
(58) Field of Search .................. 324/117, 127, 324/500, 107, 117 R, 126; 327/172, 559

(56) References Cited

U.S. PATENT DOCUMENTS 5,539,354 A 7/1996 Carsten ...................... 327/559

FOREIGN PATENT DOCUMENTS

GB 2259150 A 3/1993 ........... G01R/15/02

OTHER PUBLICATIONS

Pettinga, et al., "A Polyphase 500 kA Current Measuring System with Rogowski Coils", Sep. 1983.*
Ray, et al., "Developments in Rogowski Current Transducers", Aug. 9, 1997.*

Ray, W.F., et al., "Developments in Rogowski Current Transducers," EPE '97, Aug. 9, 1997, pp. 3.308–3.312.

Ray, W.F., "Wide Bandwidth Rogowski Current Transducers, Part II: The Integrator," EPE Journal, vol. 3, No. 2, Jun. 1993, pp. 116–122.

Ray, W.F., et al., "Wide Bandwidth Rogowski Current Transducers, Part I: The Rogowski Coil," EPE Journal, vol. 3, No. 1, Mar. 1993, pp. 51–59.

Pettinga, J.A.J, et al., "A polyphase 500kA current measuring system with Rogowski coils," IEE Proceedings, vol. 130, pt. B, No. 5, Sep. 1983, pp. 360–363.

Pettinen, et al., article extract, Rev. Sci. Instrum., vol. 51, No. 11, Nov. 1980, p. 1538.

* cited by examiner

Primary Examiner—N. Le
Assistant Examiner—Donald M Lair
(74) Attorney, Agent, or Firm—Dicke, Billig, & Czaja, PLLC (57) ABSTRACT

A current measuring device comprising a Rogowski coil (30). Connected across ends of the coil (30) is a passive integrator in two parts (34, 36), the parts being connected by a coaxial cable (32). Connected to the output of the passive integrator (34, 36), is an electronic integrator (38). At low frequencies the passive integrator (34, 36) has a substantially constant gain and the electronic integrator (38) integrates the signal from the coil (30). At high frequencies, the electronic integrator (38) has substantially constant gain and the passive integrator (34, 36) integrates the signal from the coil (30). In order to reduce high frequency voltage oscillations, the Rogowski coil (30) is terminated with a coil damping resistor that has a value that is approximately the same as a characteristic impedance of the coil.

16 Claims, 5 Drawing Sheets

CURRENT MEASURING DEVICE

BACKGROUND OF THE INVENTION

1. Field of the Invention

This invention relates to a current measuring device for measuring electrical current waveforms using a combination of a Rogowski coil and electronic processing equipment. In particular, this invention relates to improvements in such a device whereby the high frequency bandwidth of the measurement is increased whilst still retaining the capability of measuring low frequency currents.

2. Description of Related Art

A Rogowski coil is so named following publication in 1912 of an article titled "Die Messung der Magnitischen Spannung" (Arch Elektrotech1, pp141–150) by Rogowski W. and Steinhaus W. Its principle of operation is well known and is based on the fact that if a coil of uniformly spaced turns, wound is on a former of constant cross-sectional area, is arranged to form a closed loop, then the voltage induced in the coil at any instant is directly proportional to the rate of change of the total current passing through the loop at that instant. If means can be found of integrating with respect to time the voltage produced by the coil then the voltage obtained is proportional to the current passing through the loop. The combination of a Rogowski coil and means for integrating a voltage with respect to time thereby constitutes a current measuring system commonly referred to as a Rogowski transducer.

In practice there will be some small variation of the turns density of the coil and of the cross sectional area of the former. As a result the voltage produced by the coil will be slightly dependent on the position of the current in relation to the Rogowski coil loop. It is understood that reference in this specification to a Rogowski coil includes these practical tolerances.

The former around which the coil is wound is normally non-magnetic but it may be magnetic provided that the relative permeability of the magnetic material used is sufficiently small such that the material does not magnetically saturate when used to carry a Rogowski coil.

A Rogowski transducer has the advantages that the coil may be looped around a conductor, without the necessity of disconnecting the conductor; to provide a contactless and isolated current measurement and that large currents can be measured without magnetically saturating the transducer. A further advantage is that due to the use of non-magnetic material (which does not suffer from energy losses that increase with frequency), a Rogowski transducer potentially has a very high bandwidth, significantly in excess of 1 MHz and is therefore able to measure very rapidly changing currents.

Examples of known Rogowski transducers are described in the publications by Ray W F and Davis R M: "Wideband Rogowski current transducers: Part 1—The Rogowski Coil", EPE Journal, Vol 3, No.1, March 1993, pp 51–59, and Ray W F: "Wideband Rogowski current transducers: Part 2 "The Integrator", EPE Journal, Vol 3, No.2, June 1993, pp116–122.

The means for integrating the Rogowski coil voltage with respect to time may take various forms, some called "passive" means in as much as the means only utilises passive electrical components such as capacitors and resistors. Others are called "active" means in that the means also utilises active electronic components, such as semi-conducting devices and integrated circuits.

Figure 1:
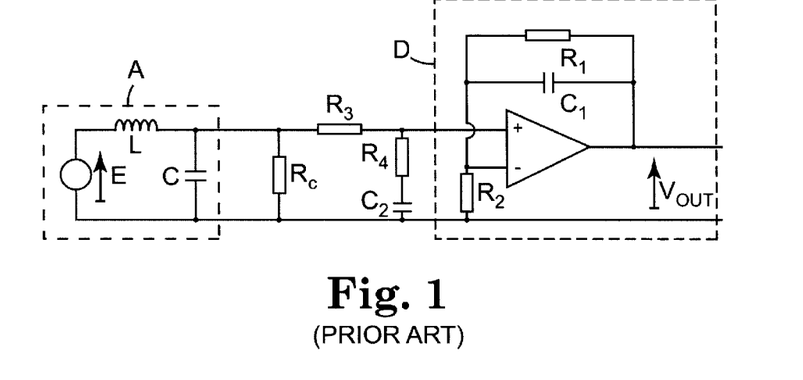
FIG. 1 shows a prior-art Rogowski current transducer.

FIG. 1 shows a Rogowski current transducer that was proposed by J. A. J. Pettinga and J. Siersema in their paper "A polyphase 500 kA current measuring system with Rogowski coils", Proc IEE, Vol 130, Pt B, No. 5, September 83, pp 360–363. This measuring system incorporates two types of passive integration, which is relevant at high frequencies, and integration using a conventional non-inverting operational amplifier, which is called "active" integration, for low frequencies.

In the circuit of FIG. 1, A represents the coil with distributed inductance L and capacitance C. The coil is connected to the remainder of the circuit by a co-axial cable terminated by a resistor $R_C$ of 50Ω, which is the characteristic impedance of the cable such that the terminating resistance seen by the coil is $R_C$. The components $R_3$, $R_4$ and $C_2$ comprise a passive integration network for which $R_3 \gg R_C$ and $R_3 \gg R_4$. A non-inverting operational amplifier circuit D acts as an integrator at low frequencies and as a unity gain amplifier at high frequencies.

Figure 2:
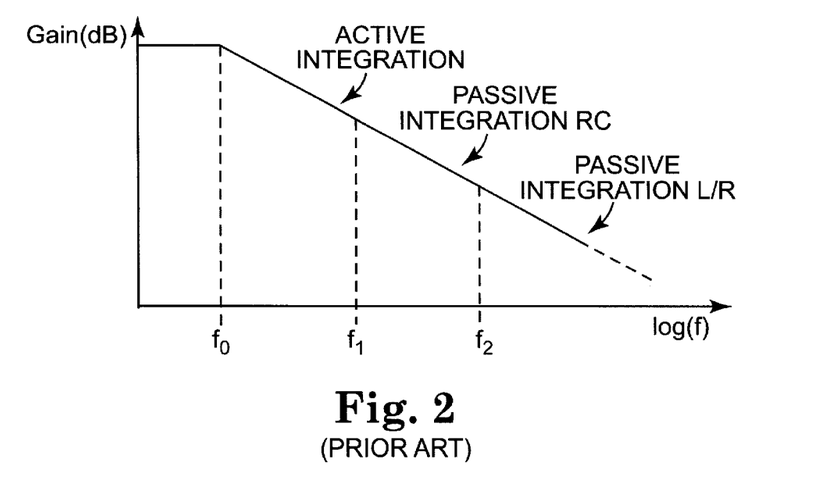
FIG. 2 shows an overall frequency characteristic for integration associated with the FIG. 1 transducer.

FIG. 2 shows the overall frequency characteristic for the integration which falls into three bands—active integration for frequencies f in the range $f_0 < f < f_1$, passive CR integration for $f_1 < f < f_2$ and passive L/R integration for $f > f_2$.

The resistors and capacitors of FIG. 1 are chosen such that for each frequency band the following behaviour occurs:

(a) The resistance $R_1$ is relatively large and its presence is ineffective for frequencies $f > f_0$.

(b) For $f_0 \ll f \ll f_1$ the impedance of L and the admittance of $C_2$ are negligible and the voltage $V^+$ at the non-inverting input of the operational amplifier is substantially the same as the voltage E induced in the coil. For integrator gains greater than 1 the behaviour of integrator D is represented by the well known relationship:

$$V_{out} = \frac{1}{C_1 R_2} \int E dt \qquad (1)$$

(c) For $f_1 \ll f \ll f_2$ the impedance of L and $C_1$ are negligible and the circuit D acts as a unity gain amplifier. Since the impedance of $R_4$ is also negligible, the network $R_3$–$C_2$ behaves as a passive integrator.

(d) For $f \gg f_2$ circuit D continues to act as a unity gain amplifier and the impedance of $C_2$ is negligible compared with that of $R_4$. The network L-$R_C$ behaves as a passive L/R integrator. This is the type of integration that has been favoured in other known Rogowski transducers.

It will be appreciated that there are significant design constraints on the relative values for the resistors and capacitors used in order to provide the required transition of behaviour from one mode of integration to the next Furthermore, in order to provide a straight-line gain-frequency relationship for the integration as shown in FIG. 2 it is important that two pairs of time constants are accurately matched, namely $$R_2 C_1 = R_3 C_2 \quad \text{and} \quad \frac{L}{R_c} = R_4 C_2 \qquad (2)$$

The matching requirement presents difficulties both in the design and in the practical setting-up and calibration of a transducer. This is disadvantageous.

The circuit of FIG. 1 suffers from several additional disadvantages that have not until now been appreciated.

Firstly the circuit of FIG. 1 uses L/R integration. It is commonly thought that L/R integration does not result in unwanted signal oscillations. However, this is because previously published analysis of Rogowski transducers that utilise L/R integration is based on a symmetrical arrangement in which the coil loop is circular, the current to be measured lies along the axis of this circular loop and there are no other currents close to the coil. In this special case each element of the coil generates the same elemental voltage and the transit times from each element to the coil termination can be averaged to produce a smooth output voltage. The coil is therefore not susceptible to oscillations. As a result, L/R integration has been utilised in prior art transducers with satisfactory results provided care is taken to ensure a symmetrical geometry as described above. However, to utilise a symmetrical arrangement it is generally necessary to use a coil with a rigid former that cannot be opened and is therefore less convenient. Furthermore, when measuring currents in closely spaced equipment it is difficult and often impossible to arrange for the current to be central and co-axial with the coil loop. There are also often currents other than the current being measured which are close to the coil. In practice, therefore, the arrangement is not symmetrical. When this is the case, the coil is susceptible to oscillations. One solution that has been proposed is to design the coil so that its natural frequency is 4 to 5 times higher than the required bandwidth for the measured current. This solution has the disadvantage that the bandwidth of the measuring system is reduced by a factor of 4 to 5 times what could be achieved if L/R integration is not utilised.

Returning to the circuit of FIG. 1, this was designed for continuous sinusoidal currents with a bandwidth of only 100 kHz. With these specific limitations the possibility of coil oscillations (which are typically several MHz) is significantly reduced and this may enable L/R integration to be used. However for current waveforms with switching transients, such as for currents in power semi-conductors, high frequency harmonics exist which extend above 1 MHz and so cause oscillations.

In addition to L/R integration, the transducer of FIG. 1 also uses CR integration. It is known that circuits that use such integration can also suffer from the problem of unwanted oscillations One solution to this problem that has been proposed is to reduce the length of the cable connecting the coil and the CR part of the circuit.

It has only now been appreciated by the inventor of the invention described herein that high frequency oscillations in Rogowski transducers, such as those of FIG. 1, result from a mismatch between the characteristic impedance of the coil and the coil termination. This arises because the terminating resistance that is appropriate for the L/R integration of FIG. 1 is relatively small, typically 50 ohms or less, whereas the characteristic impedance of a Rogowski coil is typically 500 ohms or more. This mismatch of termination causes the output voltage to be subject to high frequency oscillations initiated by current changes in conductors outside the coil loop as well as the current being measured. Mismatch of the termination is inevitable in the circuit of FIG. 1.

A further disadvantage of the measuring system of FIG. 1 is that it does not enable both the Rogowski coil and the connecting cable to be separately terminated with the correct impedance. It will be seen in FIG. 1 that if the resistor $R_C$ is chosen to correctly terminate the cable then this resistance also becomes the terminating resistance for the coil. Therefore, unless the coil has the same characteristic impedance as the cable, the coil termination will be mismatched.

A yet further disadvantage of the measuring system of FIG. 1 is that the cable capacitance adds to the coil capacitance and so significantly reduces the bandwidth of the measurement system.

SUMMARY OF THE INVENTION

An object of the present invention is to provide a current transducer that overcomes the disadvantages of the prior art.

According to the present invention there is provided a current transducer comprising a Rogowski coil having an electrically conductive coil member with a coil termination, a first integrator connected across the coil termination and a second integrator connected to the output of the first integrator, the first integrator being arranged to have a substantially constant gain at relatively low frequencies and to integrate the coil output at relatively high frequencies and the second integrator being arranged to have a substantially constant gain at relatively high frequencies and to integrate the output of the first integrator at relatively low frequencies, wherein the Rogowski coil is terminated with a resistor or resistors in combination so as to provide a terminating resistance value that is approximately the same as the characteristic impedance of the coil, thereby damping the coil and reducing its susceptibility to high frequency voltage oscillations.

Since the coil terminating resistance is matched to the coil characteristic impedance, the coil inductance plays no part in the integration performed by either of the first or second integrators. This means that high frequency oscillations associated with L/R integration are avoided and the usable bandwidth of the transducer can be significantly extended. For example, the transducer in which the invention is embodied may have a bandwidth extending from 1 Hz to greater than 1 MHz.

Preferably, the first integrator is a passive integrator. Preferably, the second integrator is an active integrator.

Preferably, the passive integrator is a network of passive components. This may include the coil damping resistor.

Preferably the active integrator uses an operational amplifier in a non-inverting mode.

The frequency at which the first integrator ceases to operate as an integrator and commences to operate at a constant gain and the frequency at which the second integrator ceases to operate at a constant gain and commences to operate as an integrator may be set to be substantially the same.

The coil former may be a continuous ring made of plastic or some other suitable material and may be rigid or flexible. However, for ease of positioning the coil for use, it is preferable that the coil can be looped around a conductor without disconnecting the conductor, in which case the coil former needs to be discontinuous and of sufficiently flexible material that it can be bent into a loop around the conductor.

The passive integrator may comprise a resistor and a capacitor. An advantage of having the coil terminated with a resistance that is matched to the coil characteristic impedance in this instance is that it eliminates L/R integration and thereby avoids the difficulties of having to match CR and L/R time constants.

Preferably, the resistor and the capacitor are connected by a cable, the resistor being mounted at the coil end of the cable and the capacitor being at the second integrator end of the cable. An advantage of having the resistor at the coil end of the cable is that it avoids reducing the bandwidth of the transducer. Preferably, the resistor and the capacitor are in series.

The damping resistor may be connected at the coil end of the connecting cable such that it is in parallel with the resistor-capacitor combination of the passive integrator. Additionally, a second damping resistor may be connected between the second integrator end of the connecting cable and the capacitor of the passive integrator at that end. This second damping resistor preferably has a value substantially the same as the characteristic impedance of the connecting cable to provide a matched termination to the cable and to reduce the susceptibility of the cable to high frequency voltage oscillations.

BRIEF DESCRIPTION OF THE DRAWINGS

Various devices for measuring current in which the present invention is embodied will now be described by way of example only and with reference to the following drawings, of which.

DETAILED DESCRIPTION OF PREFERRED EMBODIMENTS

Figure 3:
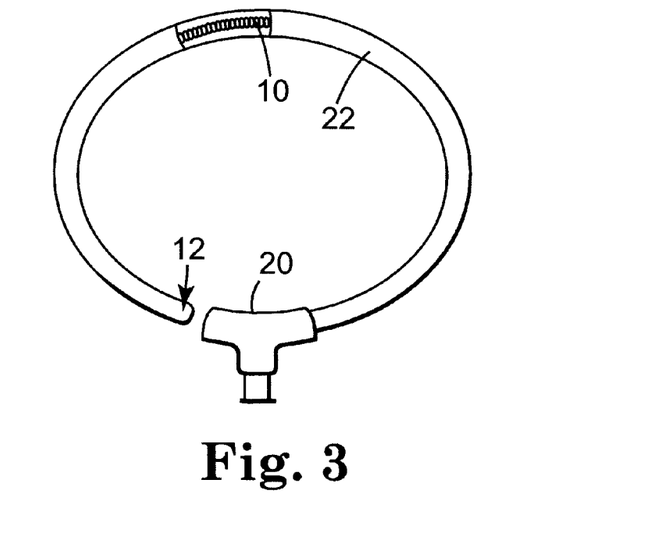
FIG. 3 shows an example of the construction of a Rogowski coil.
Figure 4:
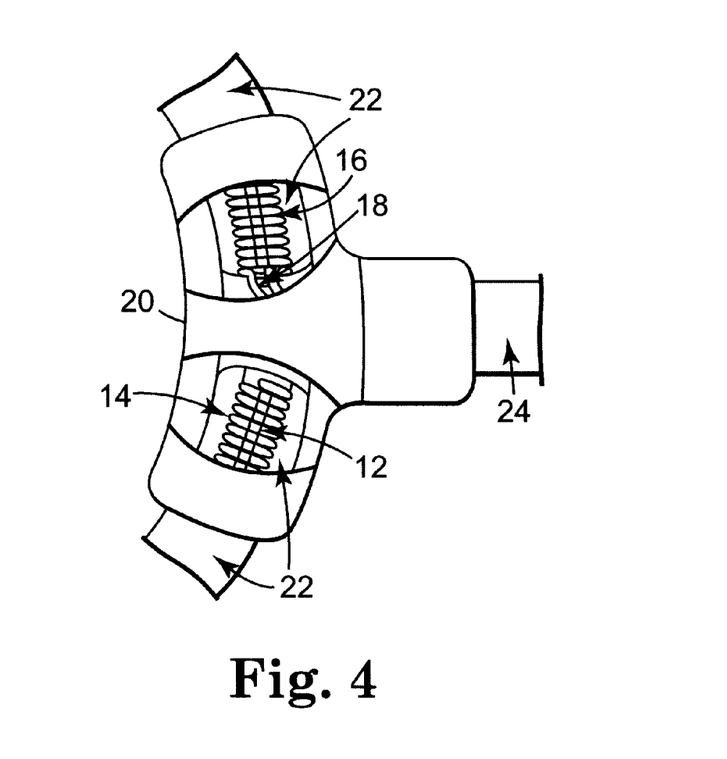
FIG. 4 is a fragmented view of a portion of the coil of FIG. 3.
Figure 5:
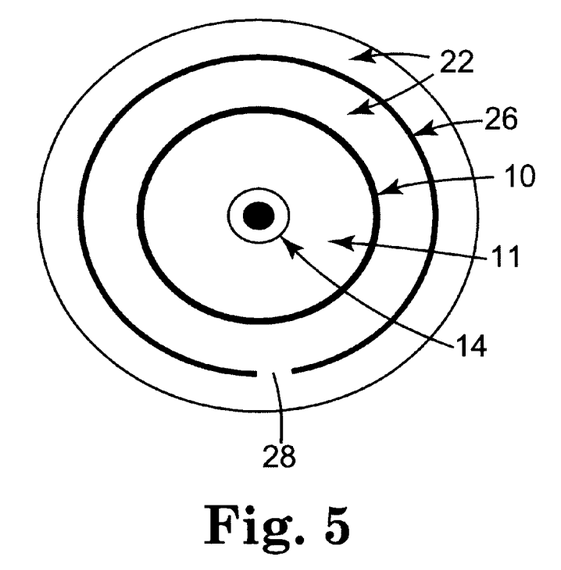
FIG. 5 is a cross section through a Rogowski coil having an electrostatic screen.
Figure 6:
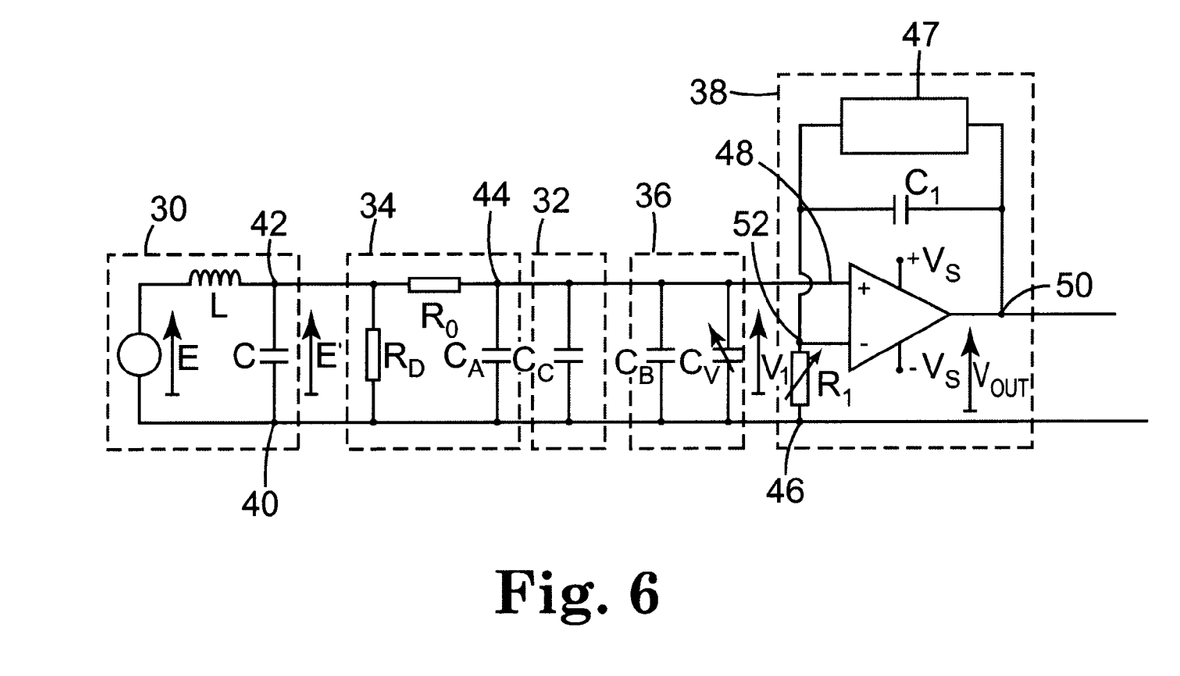
FIG. 6 is a circuit diagram of a current measuring system in which the present invention is embodied.

Referring to FIGS. 3 to 5, a Rogowski coil is shown having a flexible circular plastic former 11 (see FIG. 5) with a coil 10 wound in a uniform helix along its length. One end of the coil "the free end" 12 is connected to a return conductor 14 running along the centre of the former, as shown in FIGS. 5 and 6. The conductor 14 may be a continuation of the coil winding inserted through a hole running centrally along the axis of the former. The other "fixed" end 16 of the coil and the other end 18 of the said return conductor 14 are received in a socket in a ferrule 20 and are connected to a coil terminating network as will be described below.

The Rogowski coil 10 is covered with one or more layers of insulating material 22. The ferrule 20 to which the coil is attached has a second socket in which the insulated free end of the coil 12 is received to reduce the gap between the two ends of the coil. The hole is of such diameter as to provide a sufficiently close fit to hold the end 12 of the coil 10 in place. The output from the first part of the coil terminating network is connected to a coaxial cable 24, which may be doubly screened.

When the coil 10 is to be positioned around a current carrying conductor, typically, the "free end" 12 is released from the ferrule 20 socket so that the coil 10 can be looped around the conductor without having to disconnect or disturb the conductor. Once the coil 10 is looped around the conductor the free end 12 is inserted into the second ferrule 20 socket so that measurement can begin.

An electrostatic screen 26 is not generally necessary but if required it may be inserted within the layers of insulation 22 surrounding the Rogowski coil 10, provided that the screen does not constitute a closed turn around the coil 10.

FIG. 5 shows the cross section of a coil 10 with a concentric screen 26 having a gap 28 along the length of the coil. This is one method of ensuring the screen 26 does not constitute a closed turn. The coil screen 26 is connected to the screen of the coaxial cable 24 or to the outer screen of a doubly screened cable.

FIG. 6 is a circuit diagram of a current measuring system that comprises four parts—a Rogowski coil 30, a coaxial connecting cable 32, a passive integrator hereinafter referred to as the terminating network of which the first part 34 is at the coil end of the coaxial cable and the second part 36 is at the other end, and a non-inverting electronic integrator 38 hereinafter referred to as the integrator. Typically, the first part 34 of the terminating network is contained within a hollow space in the end of the coil former or within the plastic ferrule 20 to which the fixed end 16 of the Rogowski coil 10 is attached. The cable 24 connects the first part 34 of the terminating network to the second part 36 of the terminating network which is situated at the input of the electronic integrator 38.

The Rogowski coil 30 is represented by its equivalent circuit comprising an induced voltage source E proportional to the rate of change of the current to be measured, an inductance L and a capacitance C. The terminal 40 of the equivalent circuit corresponds to the aforesaid fixed end 16 of the coil and the terminal 42 corresponds to the connection via the axial return conductor 14 from the free end 12 of the coil. The terminal 40 is connected to the screen of the coaxial cable and the terminal 44 is connected to the inner conductor of the coaxial cable 32. At the other end of the cable 32, the cable screen is connected to the common terminal 46 of the integrator and the cable 32 inner conductor is connected to the non-inverting input 48 of the operational amplifier. The operational amplifier is powered from positive and negative voltage sources $+V_S$ and $-V_S$ with respect to the common terminal 46 of the integrator.

The coaxial cable 32 has a distributed capacitance $C_C$ that is shown as a single capacitor. A capacitor $C_A$ may be connected across the coil end of the cable and a capacitor $C_B$ in parallel with a variable capacitor $C_V$ across the integrator end of the cable such that in combination these add to give a total equivalent capacitance $C_0=C_A+C_C+C_B+C_V$. The terminating network comprises a damping resistor $R_D$ connected across the ends of the Rogowski coil 30 and, in parallel with $R_D$, a resistor $R_0$ in series with the combined capacitance $C_0$. It is preferable that the total capacitance $C_0$ for the terminating network other than $C_C$ is at the integrator end of the cable (ie $C_A=0$).

The Rogowski coil has a natural frequency $w_B=1/\sqrt{(LC)}$ radians/second which represents the upper bandwidth limit for the overall transducer. In order to avoid oscillations at or around this frequency, whilst maintaining the bandwidth, it is necessary that the combined value of the resistors $R_D$ and $R_0$ in parallel is approximately equal to $\sqrt{(L/C)}$ ohms.

There is some flexibility of choice of the values of $R_D$ and $R_0$. It is generally preferable to make $R_0$ substantially larger than $R_D$ in which case $R_D$ is set to be approximately equal to $\sqrt{(L/C)}$. However in some cases, for example for transducers for measuring relatively small currents for which a relatively high sensitivity in mV/A is required, it may be desirable to minimise the value of $R_0$ and in this case the resistor $R_D$ may be omitted and the value of $R_0$ set to be approximately equal to $\sqrt{(L/C)}$.

With the Rogowski coil 30 terminated with the appropriate resistance value and for frequencies up to the bandwidth limit, the output voltage E' from the coil is substantially the same as the voltage E induced in the coil by the current to be measured.

The output voltage $V_1$ from the terminating network is related to the coil output voltage E' by the phasor transfer function $$\frac{V_1(jw)}{E'(jw)} = \frac{1}{1+jwT_0} \quad (3)$$

where w is the frequency (rad/s) and $T_0 = R_0 C_0$ is a time constant.

At low frequencies, for which $wT_0 \ll 1$, the terminating network has unity gain. However at high frequencies for which $wT_0 \gg 1$ the terminating network has a phasor gain $1/(jwT_0)$ which, as is well known, corresponds to integration so that at high frequencies, $$V_1 = \frac{1}{T_0} \int E' \cdot dt \quad (4)$$

The terminating network therefore behaves as a unity gain network at low frequencies and as an integrator at high frequencies.

The integrator circuit 38 in FIG. 6 comprises an operational amplifier, a feedback capacitor $C_1$ connected between the output 50 and the inverting input 52, a variable resistor $R_1$ connected between input 52 and the common terminal 46, a low pass filter network 47 in parallel with $C_1$ and such other components (not shown) including supply decoupling capacitors and offset balancing potentiometers which are commonly used in operational amplifier circuits.

The variable resistor $R_1$ may comprise a fixed resistor in series with a variable resistor of combined value $R_1$ that can be varied by adjustment of the variable resistor.

Figure 7:
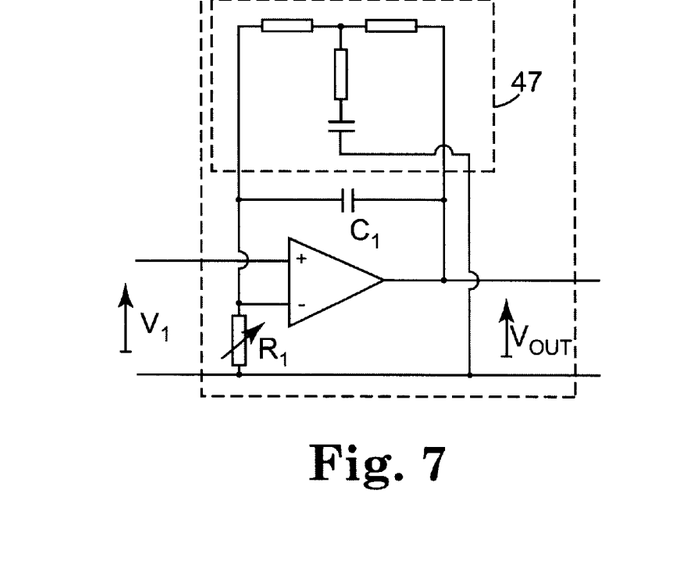
FIG. 7 is an example of the low pass filter shown in FIG. 6.

To reduce the electrical noise generated by the operational amplifier at low frequencies it is desirable to utilise a low pass filter 47 in parallel with the integration capacitor an example of which is shown in FIG. 7. This filter sets the low frequency bandwidth limit $w_A$ for the transducer below which satisfactory integrator operation is not possible. The filter has the effect of reducing integrator gain for frequencies below $w_A$. Its features, together with alternative ways of achieving the same effect, arc the subject of GB 2,259,150 B and are further explained in the previously mentioned publication titled "Wideband Rogowski current transducers: Part 2 "The Integrator"" by W. F. Ray.

For some applications the measurement of currents at relatively low frequencies is not required. As a consequence the low frequency bandwidth limit $w_A$ can be set to a relatively higher value such that low frequency noise is not a problem. In such cases the low pass filter network can be replaced by a single resistor linking the output 50 of the operational amplifier to its inverting input 52.

Provided the frequency is greater than the low frequency bandwidth limit $w_A$, the phasor transfer function relating the transducer output voltage $V_{OUT}$ to the input $V_1$ to tie integrator circuit is given by $$\frac{V_{OUT}(jw)}{V_1(jw)} = \frac{1+jwT_1}{jwT_1} \quad (5)$$

where w is the frequency (rad/s) and $T_1 = R_1 C_1$ is a time constant.

At high frequencies, for which $wT_1 \gg 1$, the integrator has unity gain. However at low frequencies for which $wT_1 \ll 1$ the integrator has a phasor gain $1/(jwT_1)$ which, as is well known, corresponds to integration so that at low frequencies, $$V_{out} = \frac{1}{T_1} \int V_1 \cdot dt \quad (6)$$

The integrator circuit of FIG. 6 therefore behaves as an integrator at low frequencies and as a unity gain amplifier at high frequencies, which is the converse of the behaviour of the coil terminating network.

It is now necessary to consider the relative performance at low and high frequencies. At low frequencies the integrator gain constant is $1/T_1$ whereas at high frequencies it is $1/T_0$. If these gains are not the same, distortion of the measured current waveform will result since low frequency components will be measured at a different sensitivity compared with high frequency components.

For satisfactory measurement, typically, the time constants $T_1$ and $T_0$ should be equal to each other such that the low frequency and high frequency gains are the same.

This requirement is demonstrated by combining equations (3) and (5) to give $$\frac{V_{OUT}(jw)}{E'(jw)} = \frac{1+jwT_1}{jwT_1(1+jwT_0)} \quad (7)$$

By making $T_0 = T_1$ $$\frac{V_{OUT}(jw)}{E'(jw)} = \frac{1}{jwT_1} \quad (8)$$

The combination of terminating network 34, 36, cable 32 and non-inverting integrator 38 will therefore provide the required integrator behaviour throughout the frequency range from the lower bandwidth limit $w_A$ through to the upper bandwidth limit $w_B$.

The procedure to equalise the time constants $T_0$ and $T_1$ and to calibrate the transducer may be as follows. Using a test current of known magnitude and low frequency such as 50 Hz or 60 Hz for which the gain of the terminating network is unity, the time constant $T_1$ of the integrator can be adjusted using the variable resistor $R_1$ to give the desired overall gain of the transducer (for example 1 mV output per Amp of measured current). The low frequency test current is then replaced by a current with a high frequency harmonic content (for example the current in a semiconductor switch which has on and off transients with a very fast rate of change) such current waveform being separately monitored by an alternative transducer of high bandwidth such as a co-axial shunt and compared with the current as measured by the Rogowski transducer. The time constant $T_0$ of the terminating network is then adjusted using the variable capacitor $C_V$ so as to make the waveform from the Rogowski transducer co-incidental and of the same shape as the waveform from the alternative transducer. When the two waveforms are the same $T_0 = T_1$.

As an alternative to the test current with a high frequency harmonic content, a sinusoidal current at a frequency greater than $1/T_1$ could be used.

Various alternative arrangements to the circuit of FIG. 6 can be used to vary the time constants $T_0$ and $T_1$. For example, the variable capacitor $C_V$ can be omitted such that capacitance $C_0$ has a fixed value. In order to vary the time constant $T_0$ it is then necessary to vary the resistance $R_0$. This may be accomplished by inserting a variable resistor in series with $R_0$ at the coil end 30 of the connecting cable 32. Similarly, the variable resistance $R_1$ can be replaced by a fixed value resistor. In order to vary the time constant $T_1$, it is then necessary to vary the capacitance $C_1$. This may be accomplished by inserting a variable capacitor in parallel with $C_1$.

The circuit of FIG. 6 can be further adapted to include a resistor $R_2$ in series with the capacitor $C_1$, so that the series combination of $C_1$ and $R_2$ is connected between the inverting input 52 and the output 50 of the operational amplifier. This may provide greater flexibility in the choice and setting of the time constants.

With $R_2$ included it may be shown that $$\frac{V_{OUT}(jw)}{E'(jw)} = \frac{1+jwT_2}{jwT_1(1+jwT_0)} \quad (9)$$

where $T_2 = C_1(R_1+R_2)$.

By arranging for the time constants $T_0$ and $T_2$ to be equal in value, equation (8) applies and integrator behaviour throughout the frequency range is achieved as before.

Figure 8:
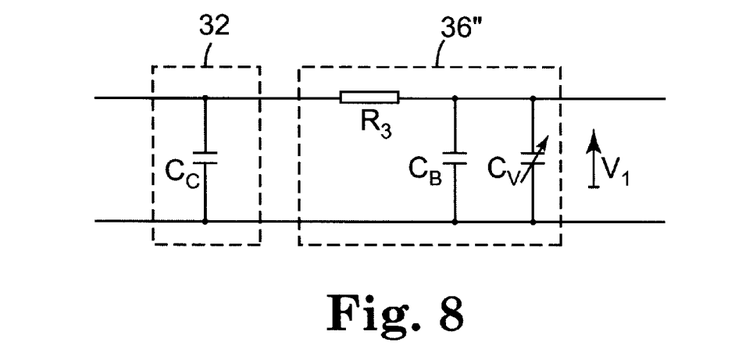
FIG. 8 is a modification to the circuit of FIG. 6.

A further modification of the circuit of FIG. 6 is shown in FIG. 8. It is standard practice with a communication cable to terminate it with its characteristic impedance by connecting a resistance of this value directly across the receiving end of the cable. This avoids the possibility of high frequency oscillations due to signal reflections from the receiving end. However, to apply this technique to the circuit of FIG. 6 would significantly attenuate the signal due to the series resistance $R_0$ which is likely to be significantly greater than the characteristic impedance (typically 50 ohms) of the cable. In order to avoid this attenuation whilst still terminating the connecting cable 32 with an impedance which matches the characteristic impedance of the cable an additional resistor $R_3$ is inserted between the connecting cable and the passive integration capacitors $C_B$, $C_V$ in the second part 36" of the terminating network. At high frequencies the capacitors $C_B$ and $C_V$ have an impedance substantially lower than the resistance $R_3$ and therefore at high frequencies $R_3$ is effectively connected across the receiving end of the cable thereby providing the desired terminating impedance.

The value of $R_3$ is arranged to be substantially the same as the characteristic impedance of the connecting cable, typically 50 ohms or 75 ohms. The value of $R_0$ (see FIG. 6) is preferably arranged to be substantially greater than $R_3$ such that, in comparison with $R_0$, $R_3$ has an insignificant effect on the time constant of the passive integrator, $T_0 = C_0 R_0$, as given by equation (3). The additional presence of $R_3$ therefore does not undermine the desired passive integration of the terminating network 34, 36 of FIG. 6.

The output of the Rogowski transducer will generally be connected to some form of monitoring or recording equipment such as an oscilloscope. The connection will generally be by coaxial cable. In order to facilitate the transmission of the high frequency components of the measurement it may be necessary to include a buffer amplifier between the output of the Rogowski transducer and such cable with appropriate termination impedances which match the impedance of the cable as is well known to communications engineers.

It will be appreciated that the current measuring systems of the invention described herein do not exhaustively cover all the possible integration networks that may be used to utilise the features of this invention and that any such alternative networks could be used.

What is claimed is:

1. A current transducer comprising a Rogowski coil having an electrically conductive coil member with a coil termination, a first integrator connected across the coil termination and a second integrator connected to the output of the first integrator, the first integrator being arranged to have a substantially constant gain at frequencies below a first frequency and to integrate the coil output at frequencies above the first frequency and the second integrator being arranged to have a substantially constant gain at frequencies above a second frequency and to integrate the output of the first integrator at frequencies below the second frequency, wherein the Rogowski coil is terminated with a coil damping resistor or resistors in combination, the resistor or resistors having a damping resistance value which is substantially the same as a characteristic impedance of the coil so as to damp the coil and reduce high frequency voltage oscillations; and wherein the first integrator comprises a cable connecting the coil to the second integrator and a cable damping resistance substantially equal to the characteristic impedance of the cable and connected in series with the cable and the second integrator.

2. A current transducer as claimed in claim 1, wherein the first integrator is a passive integrator.

3. A current transducer as claimed in claim 2, wherein the passive integrator includes the coil damping resistor.

4. A current transducer as claimed in claim 1, wherein the second integrator is an active integrator.

5. A current transducer as claimed in claim 1, wherein the first integrator comprises a first resistor connected in series between the cable and the coil.

6. A current transducer as claimed in claim 5, further comprising a second resistor connected across the coil, the coil damping resistance being the first and second resistors in combination.

7. A current transducer as claimed in claim 1, wherein the first integrator comprises a capacitor.

8. A current transducer as claim 7, wherein the capacitor is a variable capacitor.

9. A current transducer as claimed in claim 7, wherein the capacitor is connected between the cable and the second integrator.

10. A current transducer as claimed in claim 1, wherein the second integrator is non-inverting.

11. A current transducer as claimed in claim 1, wherein the first and second frequencies are set to be substantially the same.

12. A current transducer as claimed in claim 1, wherein the coil is wound around a former.

13. A current transducer as claimed in claim 12, wherein the former is made of plastic.

14. A current transducer as claimed in claim 12, wherein the former is rigid or flexible.

15. A current transducer as claimed in claim 14, wherein the Rogowski coil is made of a flexible material, thereby to enable it to be bent into a loop around a conductor.

16. A current transducer as claimed in claim 1, in which the combined transfer function of the first and second integrator combination is:

$$\frac{V_{OUT}(jw)}{E'(jw)} = \frac{1+jwT_1}{jwT_1(1+jwT_0)}$$

where $V_{OUT}$ is the output voltage,

E' is the input voltage, $T_0$ is the first integrator time constant, and $T_1$ is the second integrator time constant.

* * * * *